United States Patent
Kruse et al.

(10) Patent No.: US 12,096,323 B2
(45) Date of Patent: Sep. 17, 2024

(54) DEVICE, SYSTEM, AND METHOD FOR SENSOR PROVISIONING

(71) Applicant: ndustrial.io, Inc., Raleigh, NC (US)

(72) Inventors: Bret Kruse, Raleigh, NC (US); John Crawford, Raleigh, NC (US); Taylor Brown, Raleigh, NC (US); Jason Massey, Raleigh, NC (US); Charles Tuck, Raleigh, NC (US); John Hunt, Raleigh, NC (US); Chinmay Adhvaryu, Raleigh, NC (US); Robert Marvin Andrews, Raleigh, NC (US)

(73) Assignee: ndustrial.io, Inc., Durham, NC (US)

( * ) Notice: Subject to any disclaimer, the term of this patent is extended or adjusted under 35 U.S.C. 154(b) by 0 days.

(21) Appl. No.: 18/148,872

(22) Filed: Dec. 30, 2022

(65) Prior Publication Data
US 2023/0136760 A1 May 4, 2023

Related U.S. Application Data

(63) Continuation of application No. 17/461,299, filed on Aug. 30, 2021, now Pat. No. 11,546,744, which is a continuation of application No. 16/669,584, filed on Oct. 31, 2019, now Pat. No. 11,109,204, which is a continuation of application No. PCT/US2018/030866, filed on May 3, 2018.

(60) Provisional application No. 62/500,546, filed on May 3, 2017.

(51) Int. Cl.
*H04W 4/50* (2018.01)
*H04L 41/22* (2022.01)
*H04W 4/38* (2018.01)

(52) U.S. Cl.
CPC ............... *H04W 4/50* (2018.02); *H04L 41/22* (2013.01); *H04W 4/38* (2018.02)

(58) Field of Classification Search
CPC ............ H04W 4/50; H04W 4/38; H04L 41/22
See application file for complete search history.

(56) References Cited

U.S. PATENT DOCUMENTS

| | | | |
|---|---|---|---|
| 9,246,757 B2 * | 1/2016 | Balog | H04L 12/2807 |
| 9,307,368 B1 * | 4/2016 | Bartlett | H04W 4/029 |
| 9,397,852 B2 * | 7/2016 | Sellers | G06F 3/04847 |
| 9,860,688 B2 * | 1/2018 | Kulkarni | G01S 13/878 |

(Continued)

FOREIGN PATENT DOCUMENTS

WO    2016196996 A1    12/2016

OTHER PUBLICATIONS

ISA/KR; International Search Report and Written Opinion for International Patent Application No. PCT/US2018/030866 dated Oct. 29, 2018, 15 pages.

(Continued)

*Primary Examiner* — Jimmy H Tran
(74) *Attorney, Agent, or Firm* — NK Patent Law

(57) ABSTRACT

Disclosed herein are methods, systems, and devices for reducing user effort for sensor provisioning. In one embodiment, a system includes one or more processors and one or more memories including program instructions. The program instructions when executed are configured for receiving and storing initial sensor provisioning instructions from a graphical user interface (GUI) and provisioning a first plurality of sensors using the initial sensor provisioning instructions.

20 Claims, 14 Drawing Sheets

(56) References Cited

U.S. PATENT DOCUMENTS

| | | | | |
|---|---|---|---|---|
| 10,091,015 | B2* | 10/2018 | Kennedy | H04L 41/0806 |
| 10,581,972 | B1* | 3/2020 | GokulRaju | H04W 4/80 |
| 2005/0253722 | A1* | 11/2005 | Droms | H04L 61/4511 |
| | | | | 340/572.1 |
| 2007/0044539 | A1 | 3/2007 | Sabol et al. | |
| 2007/0085683 | A1* | 4/2007 | Ciarcia | G08B 13/2417 |
| | | | | 340/572.1 |
| 2008/0052757 | A1 | 2/2008 | Gulati et al. | |
| 2009/0216438 | A1* | 8/2009 | Shafer | G01C 21/206 |
| | | | | 701/414 |
| 2009/0307255 | A1* | 12/2009 | Park | G06F 16/25 |
| | | | | 707/999.102 |
| 2011/0071656 | A1* | 3/2011 | McKiel, Jr. | G06N 5/02 |
| | | | | 706/54 |
| 2011/0191753 | A1* | 8/2011 | Ghercioiu | G06F 9/44521 |
| | | | | 717/132 |
| 2012/0130513 | A1* | 5/2012 | Hao | G05B 15/02 |
| | | | | 700/90 |
| 2012/0293823 | A1* | 11/2012 | Gribel | G06F 3/1285 |
| | | | | 358/1.13 |
| 2013/0047120 | A1* | 2/2013 | Albright | G01C 21/206 |
| | | | | 715/810 |
| 2013/0191755 | A1* | 7/2013 | Balog | H04L 41/0806 |
| | | | | 709/222 |
| 2013/0226451 | A1* | 8/2013 | O'Neill | H04W 4/027 |
| | | | | 701/450 |
| 2014/0068486 | A1* | 3/2014 | Sellers | H04L 12/2818 |
| | | | | 715/771 |
| 2014/0141803 | A1* | 5/2014 | Marti | G01C 21/206 |
| | | | | 455/456.2 |
| 2014/0214460 | A1* | 7/2014 | Rahnama | H04L 41/24 |
| | | | | 705/5 |
| 2014/0240735 | A1* | 8/2014 | Salgado | G06K 15/1815 |
| | | | | 358/1.13 |
| 2014/0278281 | A1* | 9/2014 | Vaynriber | G06F 30/18 |
| | | | | 703/1 |
| 2014/0344269 | A1* | 11/2014 | Dong | H04L 67/12 |
| | | | | 707/802 |
| 2015/0006696 | A1* | 1/2015 | Hershberg | G06F 9/451 |
| | | | | 709/223 |
| 2015/0248275 | A1* | 9/2015 | Gallo | G01T 7/00 |
| | | | | 702/189 |
| 2015/0248503 | A1* | 9/2015 | Glunz | G06T 17/00 |
| | | | | 703/1 |
| 2015/0273693 | A1* | 10/2015 | Cohen | B25J 13/006 |
| | | | | 901/47 |
| 2015/0294431 | A1* | 10/2015 | Fiorucci | G07B 15/02 |
| | | | | 705/13 |
| 2015/0363562 | A1* | 12/2015 | Hallwachs | G16H 80/00 |
| | | | | 705/3 |
| 2015/0363563 | A1* | 12/2015 | Hallwachs | G16H 40/67 |
| | | | | 705/3 |
| 2016/0021040 | A1* | 1/2016 | Frei | H04L 61/5061 |
| | | | | 709/224 |
| 2016/0026729 | A1* | 1/2016 | Gil | H04L 67/12 |
| | | | | 715/234 |
| 2016/0028605 | A1* | 1/2016 | Gil | H04W 4/38 |
| | | | | 709/224 |
| 2016/0127172 | A1* | 5/2016 | Shaw | H04L 41/0806 |
| | | | | 709/223 |
| 2016/0140257 | A1* | 5/2016 | Vega | G06F 30/13 |
| | | | | 703/1 |
| 2016/0173293 | A1* | 6/2016 | Kennedy | H04W 4/70 |
| | | | | 709/222 |
| 2016/0269851 | A1* | 9/2016 | Baumert | H04L 12/2803 |
| 2016/0309304 | A1* | 10/2016 | Subramanian | H04W 4/80 |
| 2016/0323392 | A1* | 11/2016 | Lawson | G06F 16/2471 |
| 2016/0328187 | A1* | 11/2016 | Nathani | H04W 64/003 |
| 2016/0357522 | A1* | 12/2016 | Wee | G06F 16/29 |
| 2016/0374133 | A1* | 12/2016 | Logue | H04W 76/14 |
| 2017/0066135 | A1* | 3/2017 | Cohen | H04L 67/12 |
| 2017/0132567 | A1* | 5/2017 | Glunz | G06T 17/05 |
| 2017/0132568 | A1* | 5/2017 | Glunz | H04L 67/10 |
| 2017/0171204 | A1* | 6/2017 | Forood | H04W 4/80 |
| 2017/0187807 | A1* | 6/2017 | Clernon | H04L 67/34 |
| 2017/0207926 | A1* | 7/2017 | Gil | H04L 12/282 |
| 2017/0279682 | A1* | 9/2017 | Dawson | H04L 67/12 |
| 2017/0372223 | A1* | 12/2017 | Vaughn | G06F 16/9535 |
| 2018/0062869 | A1* | 3/2018 | Nugent | H04W 4/80 |
| 2018/0069932 | A1* | 3/2018 | Tiwari | G08B 29/18 |
| 2018/0113584 | A1* | 4/2018 | Varadi | G01C 21/343 |
| 2018/0114140 | A1* | 4/2018 | Chen | G06N 5/02 |
| 2018/0130254 | A1* | 5/2018 | Crawley | G06T 17/20 |
| 2018/0159756 | A1* | 6/2018 | Matthews | H04L 67/02 |
| 2018/0181565 | A1* | 6/2018 | Spector | G06F 16/94 |
| 2018/0197393 | A1* | 7/2018 | Gallo | G08B 25/10 |
| 2018/0205793 | A1* | 7/2018 | Loeb | G06T 19/003 |
| 2018/0213375 | A1* | 7/2018 | Roberts | G06F 17/18 |
| 2018/0365635 | A1* | 12/2018 | Lucrecio | G07C 5/00 |
| 2018/0365636 | A1* | 12/2018 | Lucrecio | G06Q 10/0833 |
| 2018/0375892 | A1* | 12/2018 | Ganor | H04L 63/20 |
| 2019/0007548 | A1* | 1/2019 | Sit | H04W 4/80 |
| 2019/0073518 | A1* | 3/2019 | Rao | H04B 10/1143 |
| 2019/0132145 | A1* | 5/2019 | O'Hora | H04L 12/2818 |
| 2019/0132329 | A1* | 5/2019 | Verberkt | H04L 63/105 |
| 2019/0156443 | A1* | 5/2019 | Hall | G06Q 30/0283 |
| 2019/0250785 | A1* | 8/2019 | Pandolfi | G06F 3/0482 |
| 2020/0059707 | A1* | 2/2020 | Lucrecio | G06Q 10/08 |
| 2020/0065123 | A1* | 2/2020 | Yang | G06F 9/455 |
| 2020/0074398 | A1* | 3/2020 | Linton | G01S 19/16 |
| 2020/0184288 | A1* | 6/2020 | Person | G06F 3/1257 |
| 2020/0226628 | A1* | 7/2020 | Snider | H04W 4/029 |
| 2020/0265288 | A1* | 8/2020 | Volkerink | H04W 4/33 |
| 2020/0285977 | A1* | 9/2020 | Brebner | H04L 67/02 |
| 2020/0334046 | A1* | 10/2020 | Yang | G06F 8/35 |
| 2021/0405839 | A1* | 12/2021 | Cao | G06F 9/452 |
| 2022/0039245 | A1* | 2/2022 | Vangeel | H05B 47/19 |
| 2022/0076347 | A1* | 3/2022 | Trainor | G08B 21/182 |
| 2022/0414281 | A1* | 12/2022 | Wodrich | G06T 17/05 |

OTHER PUBLICATIONS

EPO, Extended European Search Report in Application No. 18794830 dated Dec. 11, 2020, 9 pages.

USPTO; Non-Final Office Action for U.S. Appl. No. 16/669,584 dated Sep. 30, 2020, 16 pages.

WIPO; International Preliminary Report on Patentability for International Patent Application No. PCT/US2018/030866 dated Nov. 5, 2019, 13 pages.

Facchinetti, Tullio, et al, "Design and implementation of a web-centric remote data acquisition system", IEEE 21st International Conference on Emerging Technologies and Factory Automation, ETFA, Sep. 6, 2016, 8 pages.

EPO, Communication pursuant to Article 94(3) EPC in Application No. 18794830.2 dated Jun. 13, 2022, 9 pages.

IEE. "People Counter." Aug. 24, 2012, XP055608067. Retrieved from the Internet: URL:https://www.iee.lu/media/571896f44064d_120824-fs-people-counter-en-web.pdf [retrieved on Jul. 23, 2019], 8 pages.

USPTO; Non-Final Office Action for U.S. Appl. No. 17/461,299 dated Feb. 16, 2022, 17 pages.

EPO, Office Action for corresponding European Patent Application No. 18794830.2, dated Nov. 22, 2023, 8 pages.

* cited by examiner

DEVICE, SYSTEM, AND METHOD FOR SENSOR PROVISIONING

CROSS-REFERENCE TO RELATED APPLICATIONS

This application is a continuation of U.S. Non-Provisional application Ser. No. 17/461,299 entitled "DEVICE, SYSTEM, AND METHOD FOR SENSOR PROVISIONING" filed on Aug. 30, 2021, which is a continuation of U.S. Non-Provisional application Ser. No. 16/669,584 entitled "DEVICE, SYSTEM, AND METHOD FOR SENSOR PROVISIONING" filed on Oct. 31, 2019, issued as U.S. Pat. No. 11,109,204 on Aug. 31, 2021, which is a continuation of PCT Patent Application No. PCT/US2018/030866 entitled "DEVICE, SYSTEM, AND METHOD FOR SENSOR PROVISIONING" filed on May 3, 2018, which claims benefit of and priority to U.S. Provisional Patent Application No. 62/500,546 entitled "DEVICE, SYSTEM, AND METHOD FOR SENSOR PROVISIONING" filed on May 3, 2017, the contents of all of which are incorporated by reference herein.

TECHNICAL FIELD

The present invention relates to sensor networks, and more specifically to sensor provisioning in sensor networks.

BACKGROUND

With the recent growth in the Internet of Things (IoT), wireless sensor capabilities continue to improve with reduced costs. For environmental monitoring of large indoor areas, wireless sensor networks provide a cost effective method with minimal cabling infrastructure. Battery powered sensors, such as temperature and/or humidity sensors, may be networked using standardized wireless protocols to a centralized monitoring system. Environmental control systems for these areas may then be optimized using the centralized monitoring system.

However, provisioning these sensors for installation into large and dense sensor networks requires a significant human effort. Current methods are primarily based on manual solutions with a combination of some geographic information system (GIS) program and/or computer aided design (CAD) program to create geometries within the programs. These geometries are then exported and the provisioning data is manually generated. Other solutions include web-based programs that export an indoor map of a facility to be monitored. A user on the backend will manually mark different areas in a CAD program and then represent that imagery on a read-only interface for provisioning. The process involves close interaction with CAD teams and sensor installer teams.

As such; devices, systems and methods are needed to reduce the labor intensive effort of provisioning sensors for large and/or densely populated sensor networks.

SUMMARY

The problem of reducing user effort for sensor provisioning is solved by a system comprising of one or more processors and one or more memories including program instructions. The program instructions when executed are configured to receive and store initial sensor provisioning instructions from a graphical user interface (GUI) and provision a first plurality of sensors using the initial sensor provisioning instructions. The system has been shown to reduce human labor for provisioning the first plurality of sensors from forty hours to just a few hours in the disclosed example.

In some embodiments, the provisioning of the first plurality of sensors may include generating metadata for each sensor. The metadata may include a sensor type and a sensor deployment location. The provisioning of the first plurality of sensors may further include generating a print file including label information for each sensor. The label information may include a representation of the sensor deployment location and a representation of a unique identifier. The unique identifier may be a device specific serial number. In other embodiments, the unique identifier may be an internet protocol (IP) address or a media access control (MAC) address. For example, the unique identifier may be an IP version 6 (IPv6) address.

In some embodiments the GUI may be configured to receive georeferenced map data. The initial sensor provisioning instructions may include the georeferenced map data and a map location for each sensor. The georeferenced map data may be geographic information systems (GIS) data and/or geospatial data. The georeferenced map data may be raster data and/or vector data. The georeferenced map data may also include a plurality of longitude and latitude coordinates, and/or elevation data. The georeferenced map data may be provided by a map service such as Natural Earth, Global Map, United States Geological Survey (USGS) Earth Explorer, Google® Maps, OpenStreetMap®, OpenTopgraphy, NASA Earth Observations (NEO), Sentinel Satellite Data, the International Steering Committee for Global Mapping (ISCGM) website, or the like.

In some embodiments, the program instructions, when executed may be further configured to provide a provisioning template to the GUI and the initial sensor provisioning instructions may include a template location for each sensor of the first plurality of sensors. The provisioning template may be an architectural template representing a facility to be monitored by the first plurality of sensors. The provisioning template may also include computer aided design (CAD) data. In a preferred embodiment, the facility may be a cold storage warehouse. In other embodiments, the facility may be an office complex, an apartment building, or an outdoor complex. For example, the outdoor complex may be a crop field, a state park, a city park, or the like.

In some embodiments, each sensor of the first plurality of sensors may include a wireless interface. Each sensor may also be an environmental sensor. For example, each sensor may be a temperature sensor, a humidity sensor, and/or a pressure sensor. The first plurality of sensors may also include one or more of a security sensor, a chemical sensor, a biological sensor, an acoustic sensor, an optical sensor, a flow sensor, a position sensor, a voltage sensor, a current sensor, a radio field (RF) sensor, and/or a proximity sensor.

In some embodiments, provisioning of the first plurality of sensors may further include transmitting the sensor deployment location to each sensor and each sensor may be configured to receive the sensor deployment location over a wireless connection. The wireless connection may be wireless local area network (WLAN) connection, a personal area network (PAN) connection, a near-field communications (NFC) connection, a radio frequency identification (RFID) connection, or an ultra-wideband (UWB) connection. The sensor deployment location may include a georeferenced identifier, building identifier, a room identifier, a zone identifier, and/or a wireless access point identifier. The sensor deployment location may also include an elevation identifier.

In some embodiments, the system may be a subsystem implemented within a facility monitoring system, and the facility monitoring system may be configured to receive data from each sensor of the first plurality of sensors. The facility monitoring system may be further configured to influence environmental control systems within the facility.

In some embodiments, the one or more processors and the one or more memories including program instructions may form at least a portion of a cloud-computing platform. The cloud-computing platform may be at least one of Amazon Web Services (AWS®), Microsoft Azure®, IBM Bluemix® PaaS, Google Cloud Platform®, Salesforce.com®, Adobe® cloud services, Oracle® Cloud, SAP HANA Cloud Platform® PaaS, or Rackspace® cloud services. The system may also include one or more hardware acceleration components. In other embodiments, the system may be implemented on one or more servers in a networked computing environment located within a business premise or another data center. In other embodiments, the system may be implemented within a virtual container, for example the Docker® virtual container.

In some embodiments, the GUI may be a web browser or a native software application. The web browser may be a Google Chrome® web browser, a Mozilla Firefox® web browser, an Opera® web browser, an Apple Safari® web browser, and a Microsoft Edge® web browser.

In some embodiments, the program instructions, when executed may be further configured for receiving sensor status data for each sensor after installation of the first plurality of sensors per the initial sensor provisioning instructions. The sensor status data for each sensor may also include a health status for each sensor. The health status for each sensor may include a battery health indicator and/or a sensor failure indicator.

In some embodiments, the program instructions, when executed may be further configured for generating a sensor status overlay template using the sensor status data for each sensor and the initial sensor provisioning instructions; and further configured for transmitting the sensor status overlay template to the GUI. The sensor status overlay template may illustrate per sensor status data positioned about a template location for each sensor location. The GUI may also be configured to display the sensor status overlay template with the georeferenced map data.

In some embodiments, the program instructions, when executed may be further configured for (1) transmitting at least a portion of the initial sensor provisioning instructions to the GUI, (2) receiving updated sensor provisioning instructions, and (3) provisioning a second plurality of sensors using the updated sensor provisioning instructions. The updated sensor provisioning instructions may include a delta provisioning report.

In other embodiments, a method is implemented on one or more computing devices. The method comprises receiving initial sensor provisioning instructions from a GUI and provisioning a first plurality of sensors using the initial sensor provisioning instructions.

In other embodiments, a non-transitory computer-readable storage medium stores program instructions. When the program instructions are executed on one or more computing devices, they cause the one or more computing devices to receive initial sensor provisioning instructions from a GUI and provision a first plurality of sensors using the initial sensor provisioning instructions.

In other embodiments, a system comprises a first plurality of sensors, one or more processors, and one or more memories including program instructions. When the program instructions are executed on the one or more processors, the one or more processors are configured for receiving initial sensor provisioning instructions from a GUI and provisioning the first plurality of sensors using the initial sensor provisioning instructions.

In other embodiments, a computing device comprises one or more processors and one or more memories including program instructions. When the program instructions at executed on the one or more processors, the computing device is configured to provide a GUI for a user to provision a first plurality of sensors. The GUI is further configured to receive georeferenced map data, receive an architectural template representing a facility to be monitored by the first plurality of sensors, and upon interaction with a user of the GUI, transmit initial sensor provisioning instructions over the network to a sensor provisioning tool.

In other embodiments, a method is implemented on one of more computing devices. The method comprises providing a GUI for a user to provision a first plurality of sensors. The method further comprises receiving georeferenced map data, receiving an architectural template representing a facility to be monitored by the first plurality of sensors, and upon interaction with the user of the GUI, transmitting initial sensor provisioning instructions over a network to a sensor provisioning tool.

In other embodiments, a non-transitory computer-readable storage medium stores program instructions. When the program instructions are executed on one or more computing devices, the one or more computing devices are configured to provide a GUI for a user to provision a first plurality of sensors. The GUI is further configured to receive georeferenced map data, receive an architectural template representing a facility to be monitored by the first plurality of sensors, and upon interaction with a user of the GUI, transmit initial sensor provisioning instructions over a network to a sensor provisioning tool.

The features and advantages described in this summary and the following detailed description are not all-inclusive. Many additional features and advantages will be apparent to one of ordinary skill in the art in view of the drawings, specification, and claims presented herein.

BRIEF DESCRIPTION OF THE DRAWINGS

The present embodiments are illustrated by way of example and are not intended to be limited by the figures of the accompanying drawings. In the drawings.

DETAILED DESCRIPTION

Figure 1:
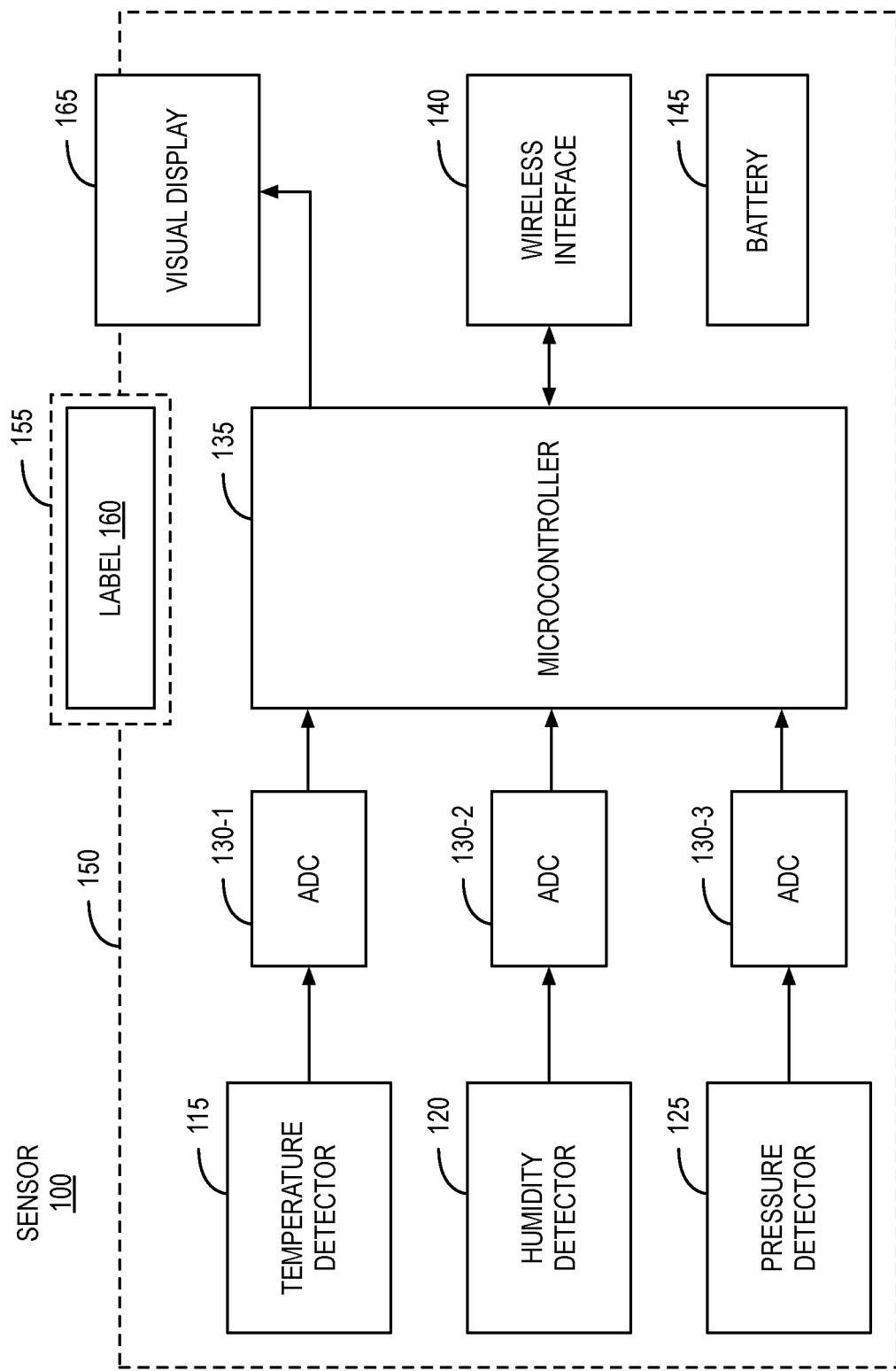
FIG. 1 depicts a block diagram illustrating a sensor in accordance with embodiments of the present disclosure.

This application discloses systems and methods for provisioning sensors within one or more facilities to be networked with a centralized monitor system.

The following description and FIG. 1 through FIG. 14 are illustrative and are not to be construed as limiting. Numerous specific details are described to provide a thorough understanding of the disclosure. However, in certain instances, well-known or conventional details are not described in order to avoid obscuring the description. References to "one embodiment" or "an embodiment" in the present disclosure can be, but not necessarily are, references to the same embodiment and such references mean at least one of the embodiments.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way.

Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only, and is not intended to further limit the scope and meaning of the disclosure or of any exemplified term. Likewise, the disclosure is not limited to various embodiments given in this specification.

Without intent to limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, all technical and scientific terms used herein have the same meaning as commonly understood by one of ordinary skill in the art to which this disclosure pertains. In the case of conflict, the present document, including definitions, will control.

FIG. 1 is a block diagram illustrating a sensor 100 for environmental monitoring. The sensor 100 includes a temperature detector 115, a humidity detector 120, and a pressure detector 125. Analog-to-digital converters (ADCs) 130-1, 130-2, and 130-3 couple the analog detector outputs to a microcontroller 135. The microcontroller 135 is coupled with a wireless interface 140. The wireless interface 140 may include a wireless local area network (WLAN) (802.11a/b/g/n/ac), a HaLow (IEEE 802.11ah), and/or a ZigBee (IEEE 802.15.4) capability. In other embodiments the wireless interface 140 may include a cellular capability such as a 3G, a 4G, or a 5G capability. The sensor may also include a short range wireless capability such as a personal area network (PAN), a near-field communications (NFC), a radio-frequency identification (RFID), and/or an ultra-wideband (UWB) capability. The wireless interface may be configured to receive provisioning information including metadata prior to deployment. The metadata may include a sensor type, a unique identifier, and/or a sensor deployment location. The wireless interface may also be configured to communicate with a remote monitoring system (not shown in FIG. 1). The sensor 100 includes a battery 145 for providing power.

The sensor 100 is packaged in an enclosure 150. The enclosure may provide a surface area 155 for a printed label 160 that may display the provisioning information. The sensor may also include a visual display 165 such as a liquid crystal display (LCD) display. The visual display 165 may be used for indicating detector information and/or the provisioning information.

Figure 2:
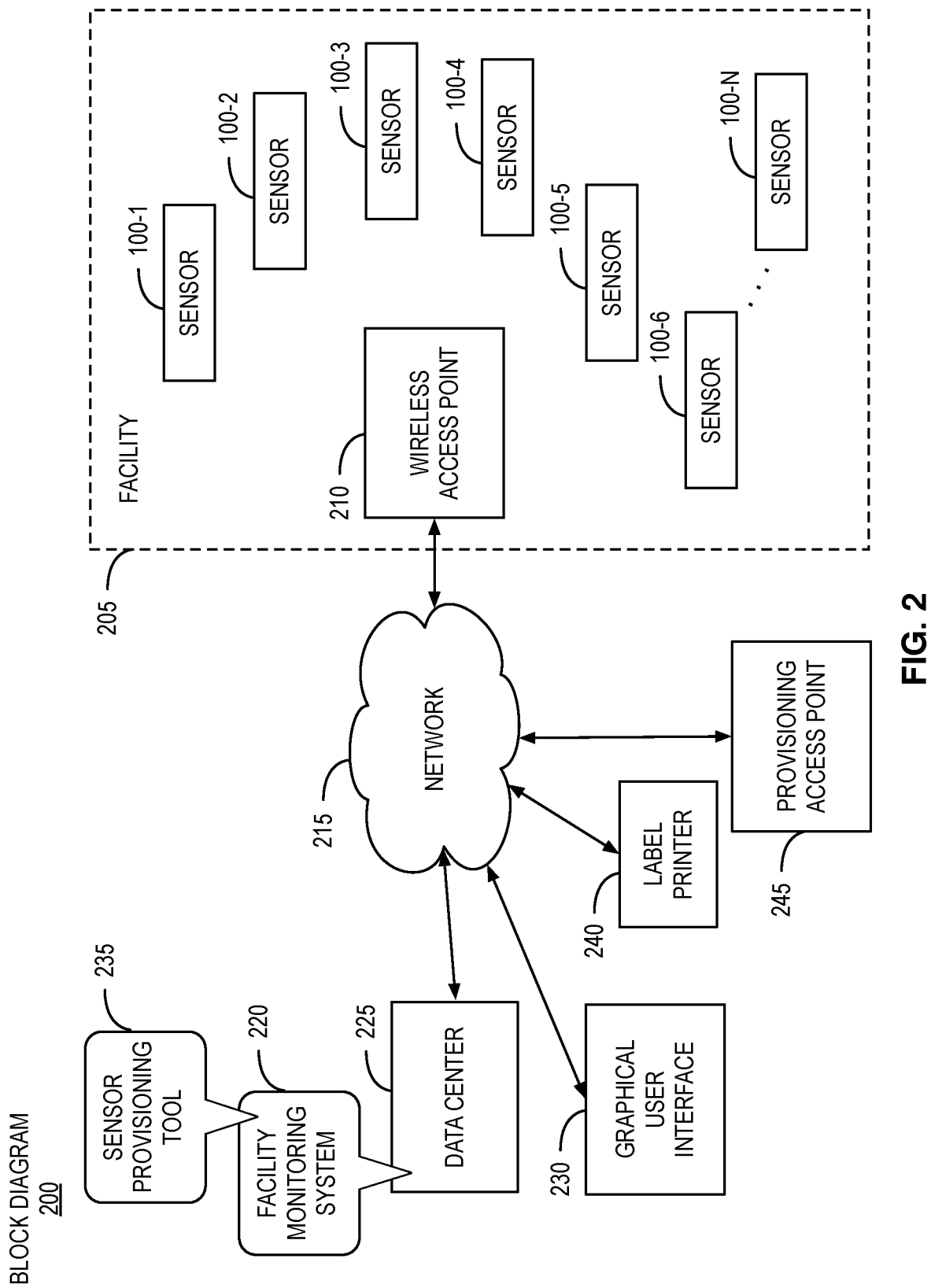
FIG. 2 depicts a block diagram illustrating a system in accordance with embodiments of the present disclosure.

FIG. 2 is a block diagram 200 illustrating a facility 205 to be environmentally monitored. The facility 205 may be any facility where multiple sensors are to be deployed. For example the facility 205 may be a climate controlled or non-climate controlled warehouse. In some embodiments, the facility 205 may be a cold storage facility requiring precise temperature control to maintain perishable items. In other embodiments, the facility 205 may be an office complex or an apartment building. In other embodiments, the facility 205 may be an outdoor complex such as a crop field, a state or city park, or the like.

Sensors 100-1 through 100-n provide the environmental monitoring. In some embodiments "n" may be at least 100 sensors. In other embodiments, "n" may be at least 1000 sensors. A wireless access point 210 is configured to receive environmental detector information from the each of the sensors 100-1 through 100-n. In some embodiments, a plurality of wireless access points 205 may be deployed. A network 215 couples the wireless access point 210 with a facility monitoring system 220 that is located within a data center 225. A graphical user interface (GUI) 230 is also coupled with the facility monitoring system 220 over the network 215

The network 215 may be a wide area network (WAN) such as the Internet. In other embodiments, the network 215 may be a local area network (LAN). The physical network equipment, cabling, etc. may be owned by the facility. In other embodiments, the LAN may be implemented as a virtual LAN (VLAN) within the Internet. In other embodiments, the LAN of the data center 225 may be extended to the wireless access point 210 and the GUI 230 by virtual private networks (VPNs). The GUI 230 may be implemented in a client device such as a personal computer, a workstation, a laptop, a tablet, a smartphone, or the like. The GUI 230 may be provided by a web browser such as Google Chrome®, Mozilla Firefox®, Opera®, Apple Safari®, or Microsoft Edge®. In other embodiments, the GUI 230 may be implemented as a native software application. In other embodiments, the GUI 230 may be implemented within the facility 205 on a computing device connected to the wireless access point 210 (not shown in FIG. 2).

In some embodiments, the sensor provisioning tool 235 may communicate with the GUI 230 using one or more transfer protocols such as a hypertext transfer protocol (HTTP) session, an HTTP secure (HTTPS) session, a secure sockets layer (SSL) protocol session, a transport layer security (TLS) protocol session, a datagram transport layer security (DTLS) protocol session, a file transfer protocol (FTP) session, a user datagram protocol (UDP), a transport control protocol (TCP), or a remote direct memory access (RDMA) transfer protocol. The sensor provisioning tool 235 may also communicate with the GUI 230 by a combination of the Internet, WAN interfaces, LAN interfaces, wired interfaces, wireless interfaces, and/or optical interfaces.

The data center 225 may be dedicated to the owner of the facility 205 or may be owned by a cloud computing vendor such as Amazon Web Services (AWS®), Microsoft Azure®, IBM Bluemix® PaaS, Google Cloud Platform®, Salesforce.com®, Adobe® cloud services, Oracle Cloud®, SAP HANA® Cloud Platform PaaS, or Rackspace® cloud services. The facility monitoring system 220 may run as an application on one or more servers (i.e. computing devices) in the data center 225. The one or more servers may include one or more processors and include one or more memories for storing program instructions that when executed provide the facility monitoring system 220. In some embodiments, the one or more servers may be provided as virtualized servers running over one or more hypervisors. The facility monitoring system 220 may run at least partially on one or more hardware acceleration components. In some embodiments, monitoring system 220 may be configured to run within a virtual container. For example, the virtual server may be the Docker® virtual server or the like.

To provision the sensors 100-1 through 100-n prior to deployment, the facility monitoring system 220 includes a sensor provisioning tool 235. The sensor provisioning tool 235 provides a user friendly method for time efficient sensor mapping. In some embodiments the sensor provisioning tool 235 may be configured as a separate software application to run on a separate server or servers from the facility monitoring system 220. In some embodiments, the sensor provisioning tool 235 may be configured to provide the GUI as a native software application over the network 215. In other embodiments, the sensor provisioning tool 235 may be configured to run on the same client device as the GUI 230.

The sensor provisioning tool 235 is configured to receive initial sensor provisioning instructions from the GUI 230 and provision the sensors 100-1 through 100-n using the initial sensor provisioning instructions. The initial sensor provisioning instructions include georeferenced map data and a map location for each sensor 100. Provisioning comprises generating the metadata for each sensor 100 including its sensor deployment location. The sensor deployment location may include a georeferenced identifier, a building identifier, a room identifier, a zone identifier, and/or a wireless access point identifier. The sensor deployment location may also include an elevation identifier. The metadata may also include the sensor type and/or the unique identifier. The unique identifier may be an internet protocol (IP) address, a media access control (MAC) address, a serial number, or the like. In some embodiments the unique identifier may be an IPv6 address. In other embodiments, the sensor type and unique identifier may be pre-labeled and/or pre-stored in memory on each sensor 100 prior to provisioning. Provisioning may include generating a print file including label information, wherein the label information includes a representation of the sensor deployment location. The label information may also include a representation of the sensor type and a representation of the unique identifier metadata.

A label printer 240 and provisioning access point 245 may be coupled to the facility monitoring system 220 over the network 215. The label printer 240 may be used to print each label 160 with the associated print file and applied to the sensor 100. In other embodiments, the provisioning access point 245 may be used to transmit the provisioning information to each sensor 100 prior to shipping to the facility 205. The provisioning information may be transmitted over the wireless interface 140 or via an electrical port (not shown in FIG. 1). The provisioning information provides a sensor installer the sensor deployment location of each sensor 100 to deploy within the facility 205. The sensor deployment location may be provided to the installer by the label 160 and/or the visual display 165 of each sensor 100.

Figure 3:
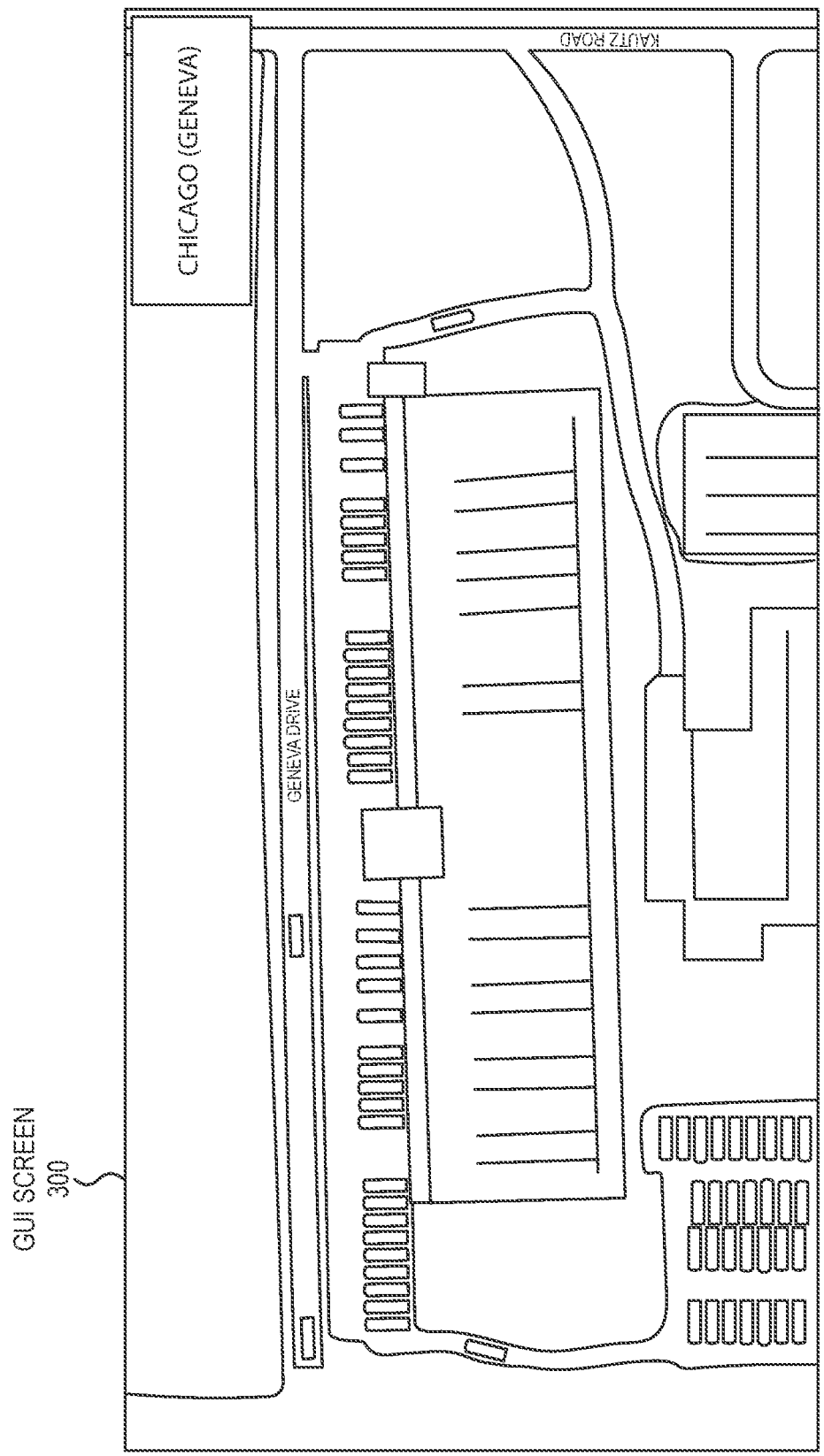
FIG. 3 through FIG. 9 each depicts a GUI screen in accordance with embodiments of the present disclosure.

To provide the initial sensor provisioning instructions, georeferenced map data associated with the facility 205 is received by the GUI 230 and displayed as a map for a user. FIG. 3 illustrates a screenshot 300 displaying a cold storage facility. The georeferenced map data may be geographic information systems (GIS) data and/or geospatial data. The georeferenced map data may be formatted as raster data and/or vector data. The georeferenced map data may include longitude and latitude coordinates. The georeferenced map data may also include elevation data. The georeferenced map data may be provided by an independent mapping source (not shown in FIG. 2) such as Natural Earth, Global Map, United States Geological Survey (USGS) Earth Explorer, Google Maps, OpenStreetMap, OpenTopgraphy, NASA Earth Observations (NEO), Sentinel Satellite Data, and/or International Steering Committee for Global Mapping (ISCGM) website. The georeferenced map data may be provided directly from the independent mapping source or indirectly via the sensor provisioning tool 235.

Figure 4:
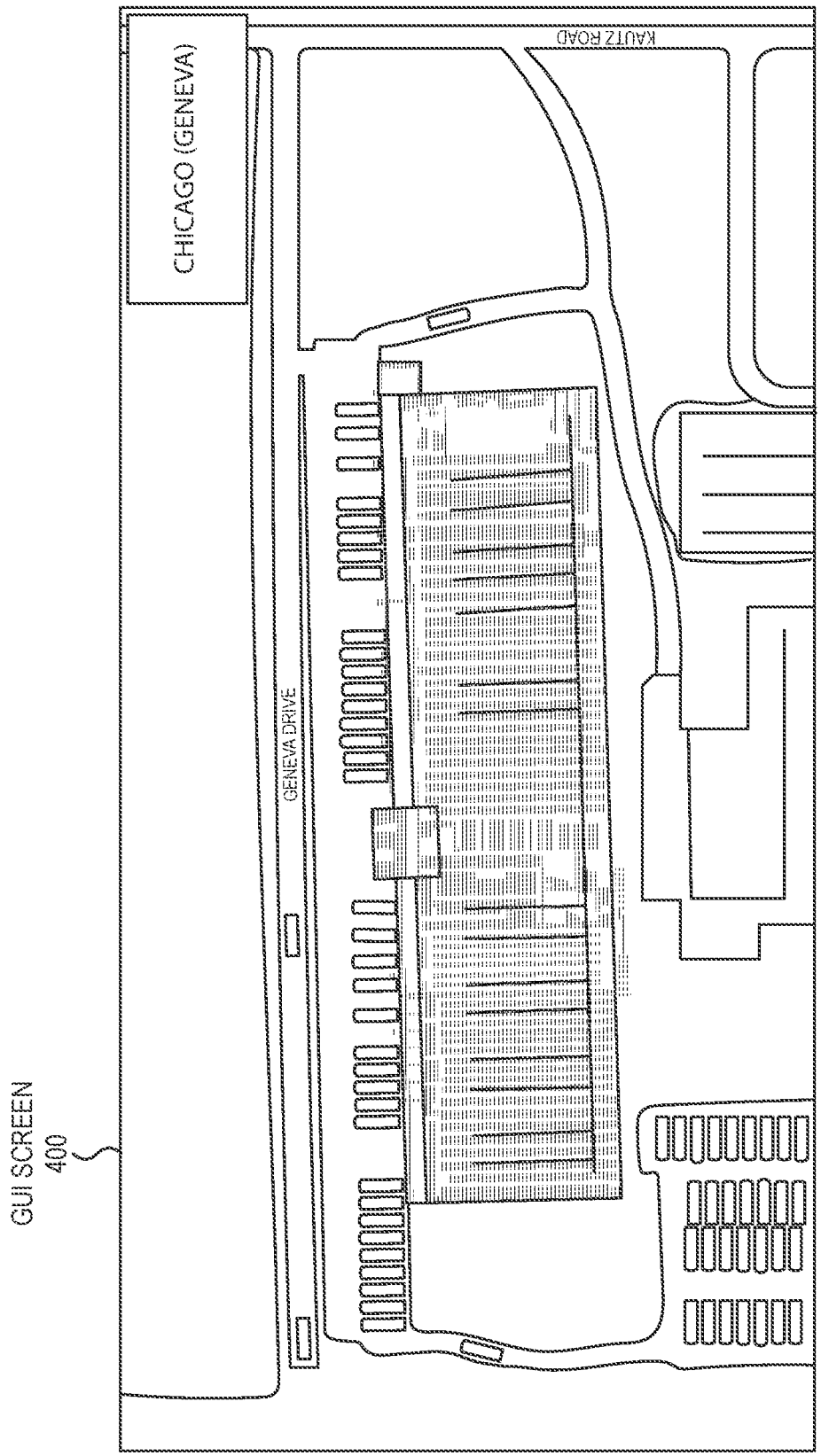

Next, the GUI 230 receives a provisioning template, such as an architectural template of the facility 205. The architectural template may include computer aided design (CAD) data. The architectural template may be formatted as a CAD file or a picture file. The architectural template may include 2D and/or 3D data. The sensor provisioning tool 235 configures the GUI 230 to allow the user to position the provisioning template over the displayed map matching to the facility representation. The GUI 230 may also allow the user to adjust screen dimensions of the provisioning template. FIG. 4 illustrates a screenshot 400 after the user has positioned and adjusted the screen dimensions of the provisioning template.

Figure 5:
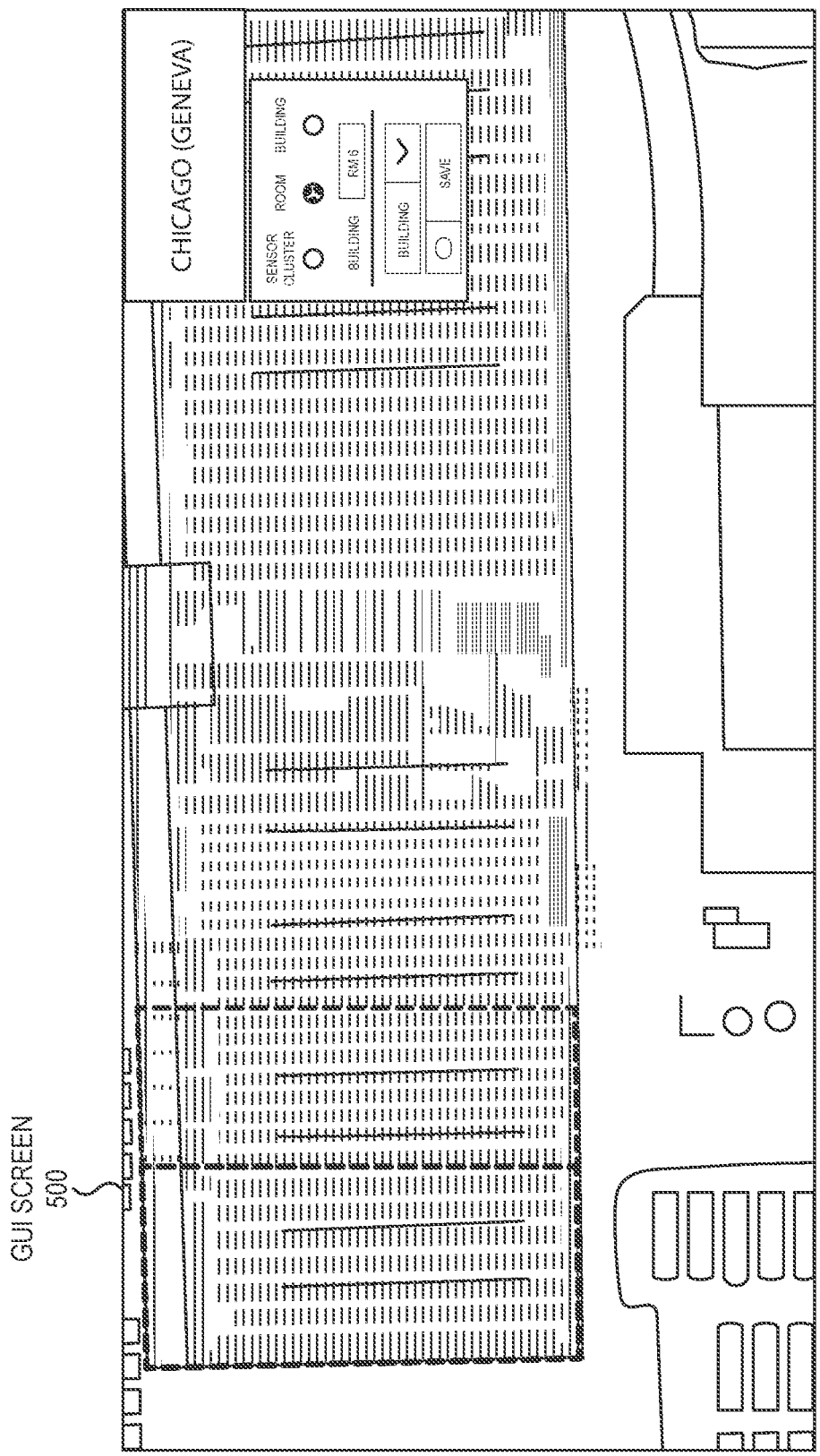

The sensor provisioning tool 235 further configures the GUI 230 to allow the user to create geometries over the provisioning template. The geometries may be used to create rooms or zones for clusters of the sensors 100-1 through 100-n. The user may first create a building geometry with the outline of the provisioning template. The user may apply a building name to the building geometry. Next the user identifies the zones within the outline of the provisioning template using zone geometries. The user may also apply zone names to each zone geometry. FIG. 5 illustrates a screenshot 500 after the user has created the zones.

Figure 6:
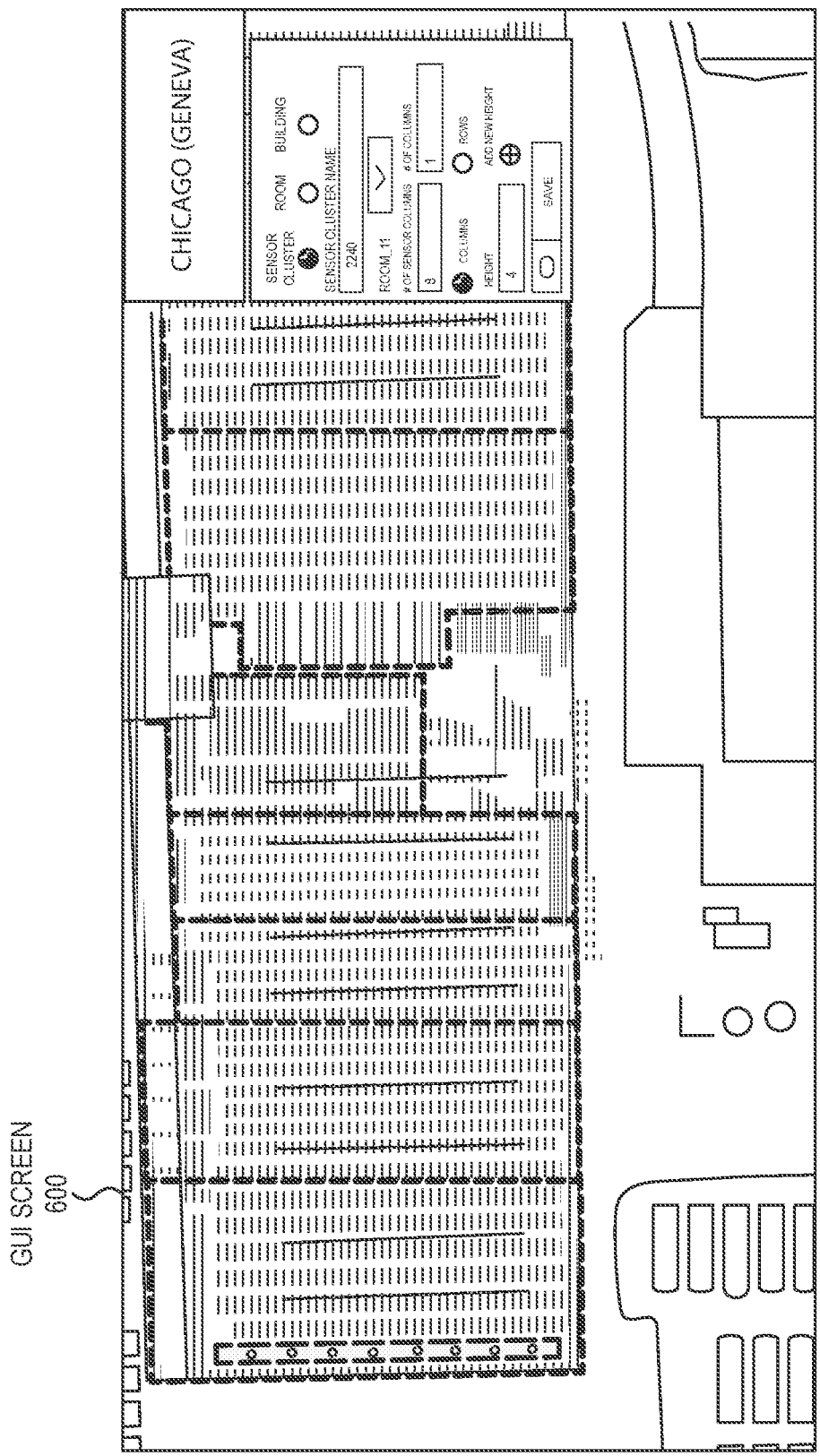
Figure 7:
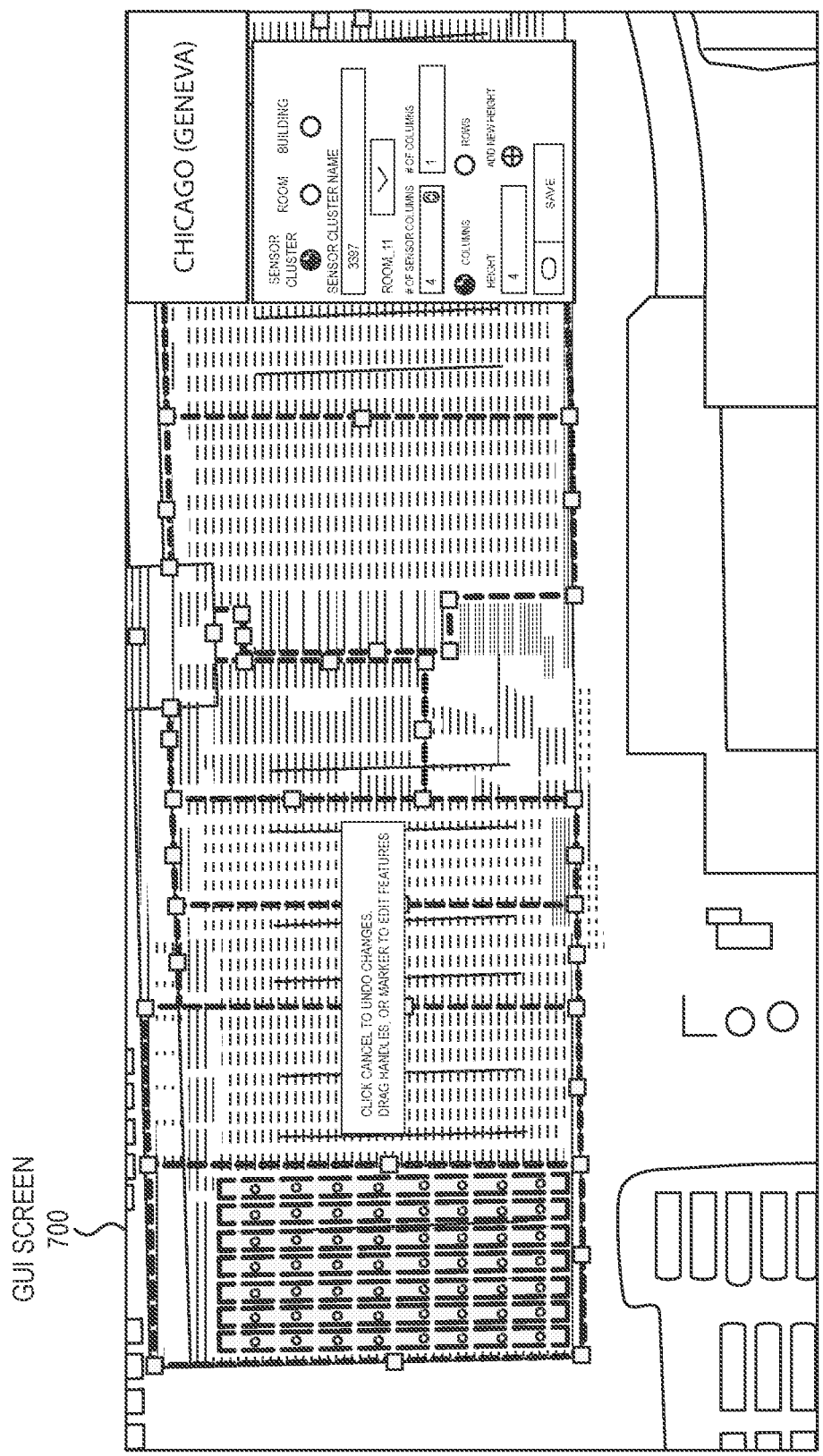

The sensor provisioning tool 235 further configures the GUI 230 to allow the user to position sensor representations within each zone geometry. Sensor representations may be copied and pasted to fully populate each zone. For example, a first sensor representation may be placed within a zone. The first sensor representation may be copied and pasted to create a first row of sensor representations. FIG. 6 illustrates a screenshot 600 after the user has created the first row of sensor representations. The first row may be copied and pasted to fully populate a first zone geometry as illustrated in screenshot 700 of FIG. 7.

Figure 8:
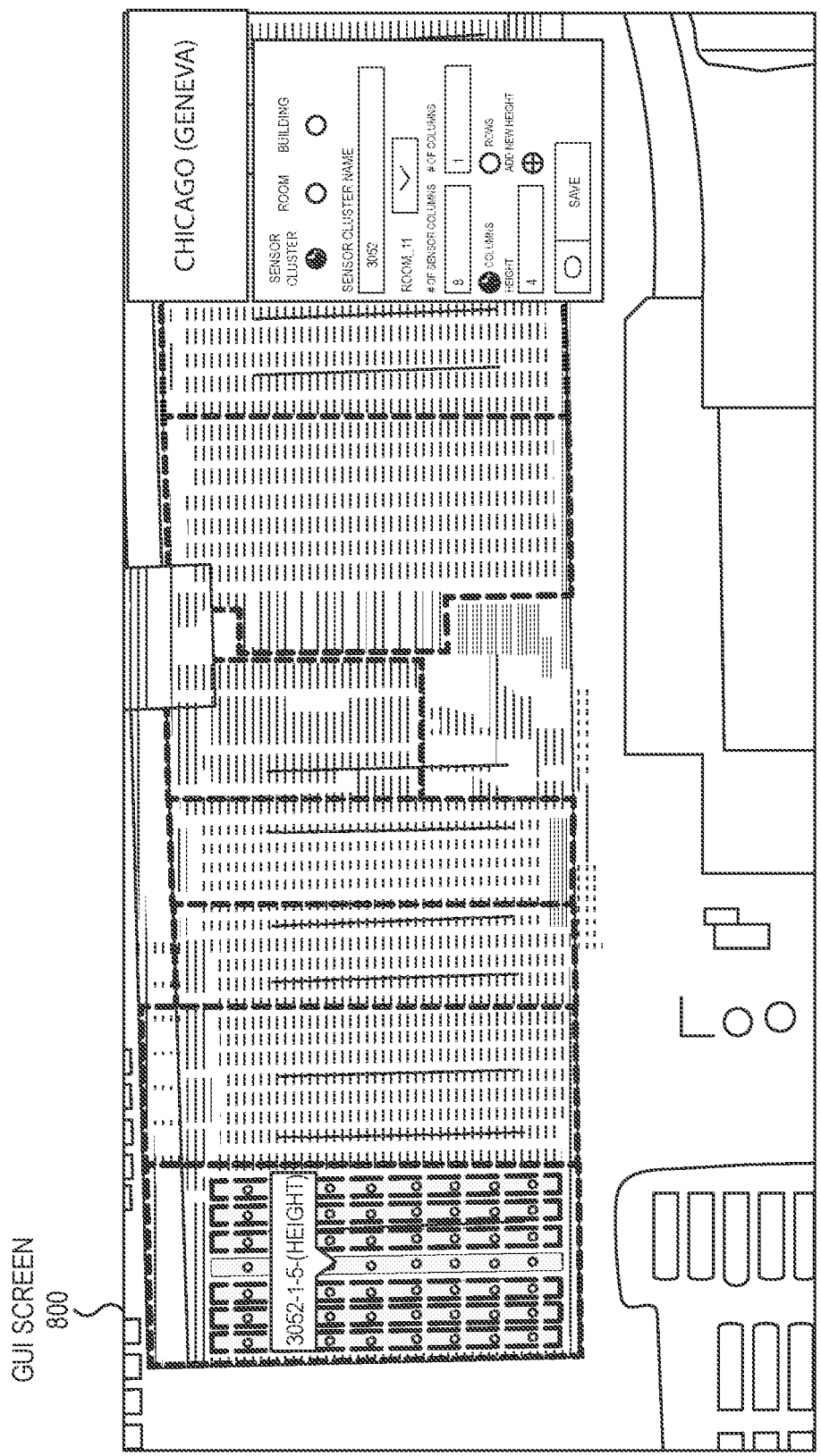

The sensor provisioning tool 235 may programmatically name each sensor based on zone names and zone locations as illustrated in screenshot 800 of FIG. 8. In some embodiments, the senor provisioning tool may generate the unique identifier of each sensor 100 using the building name, zone names, and zone locations. Communication between the GUI 230 and the sensor provisioning tool 235 may comprise JavaScript Object Notation (JSON) packets.

In other embodiments, the sensors 100-1 through 100-n may be security sensors such as contact, motion, and/or a glass breakage detectors. The facility monitoring system 220 may be a security (e.g. intrusion detection) system.

In other embodiments, the sensors 100-1 through 100-n may be chemical, biological, acoustic, optical, flow, position, or proximity sensors. The facility monitoring system 220 may be an industrial hazard monitoring system.

In other embodiments, the sensors 100-1 through 100-n may be electrical sensors for monitoring voltage, current, radio frequency (RF) fields, and/or magnetic fields. The sensors 100-1 through 100-n may also be wirelessly connected using mesh networking protocols to the wireless access point 210.

Figure 9:
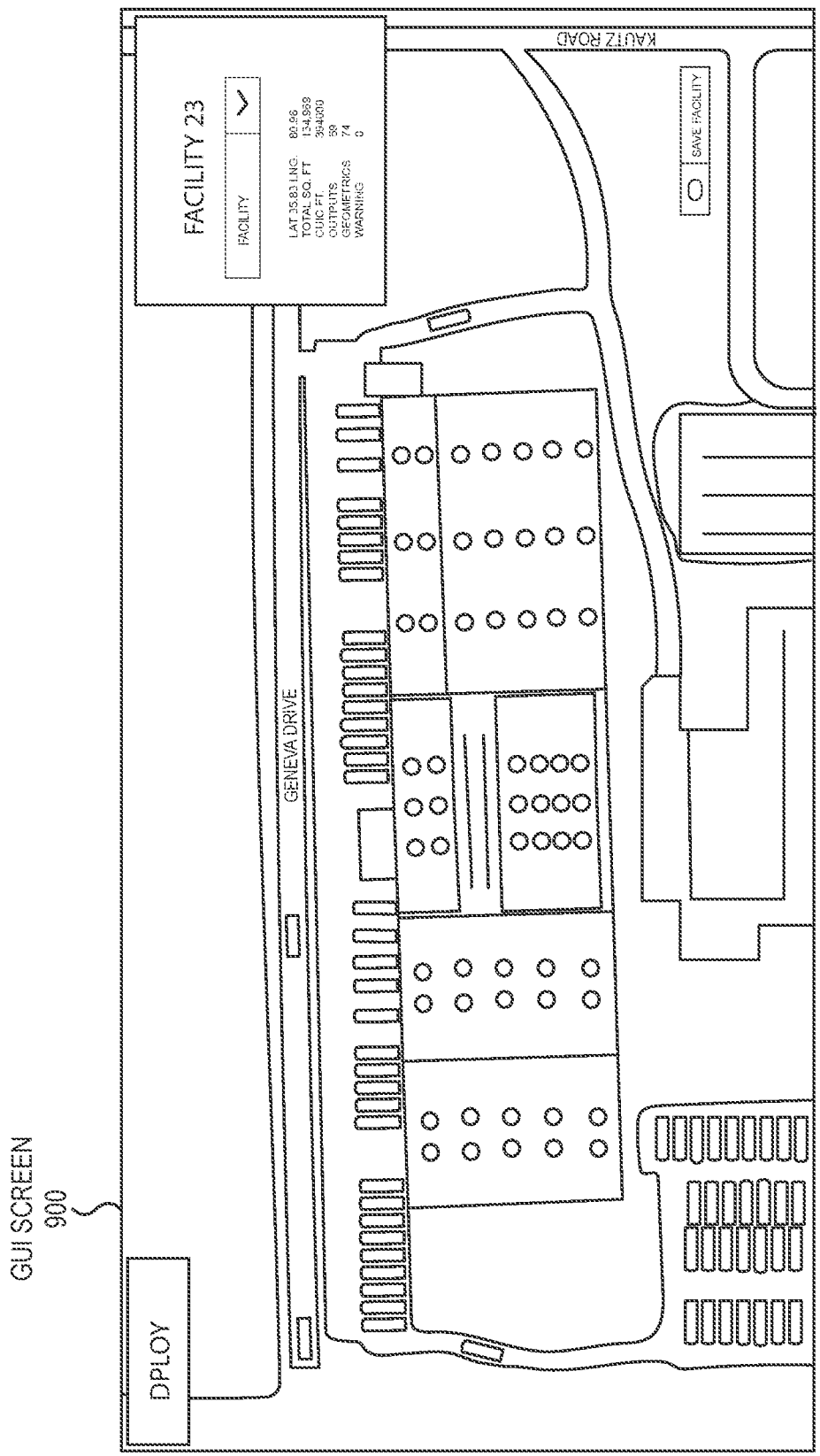

FIG. 9 illustrates a GUI screen 900 of ndustrial.io's sensor provisioning tool named "Dploy" in accordance with embodiments of the present disclosure. The GUI screen 900 displays a facility with four zones. The left zone displays twenty provisioned sensors. The right zone displays twenty-one provisioned sensors. The upper center and lower center zones each display six and twelve provision sensors respectively. Metadata on the facility is shown in the table to the right. Tool icons for provisioning and adjusting the display are shown on the left.

Figure 10:
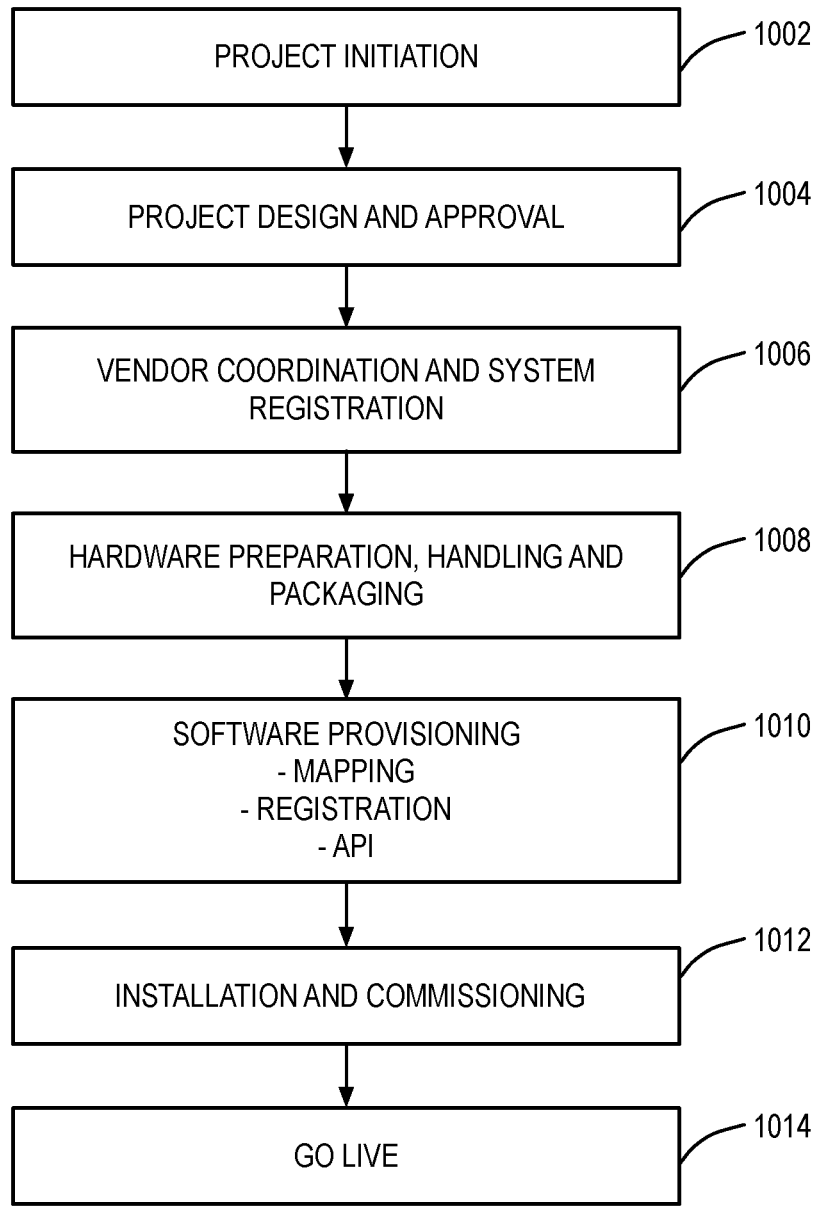
FIG. 10 depicts a flowchart in accordance with embodiments of the present disclosure.

FIG. 10 illustrates a flowchart 1000 for a typical sensor deployment in accordance with embodiments of the present disclosure. The project is first initialized (i.e. kicked off) in step 1002. Project design and approval is completed in step 1004. Vendor coordination and system registration occurs in step 1006. Hardware (e.g. sensors, access points, etc.) preparation and packaging are completed in step 1008. In step 1010, software provisioning for the sensors occurs including mapping, registration, and definition of application programming interfaces (APIs). Installation and commissioning of the system occurs in step 1012 and the system finally goes live in step 1014.

In some embodiments, the sensor provisioning tool 235 may also be used to monitor sensors after deployment. For example the sensor provisioning tool 235 may be further configured for receiving sensor status data for each sensor after installation per the initial sensor provisioning instructions. The sensor status data may also include a health status for each sensor. The health status for each sensor may include a battery health indicator and/or a sensor failure indication.

The sensor provisioning tool 235 may be further configured for generating a sensor status overlay template using the sensor status data and the initial sensor provisioning instructions; and may be further configured for transmitting the sensor status overlay template to the GUI 230 for monitor by the user. The sensor status overlay template may illustrate per sensor status data positioned about a template location for each sensor location. The GUI 230 may also be configured to display the sensor status overlay template with the georeferenced map data.

Figure 11:
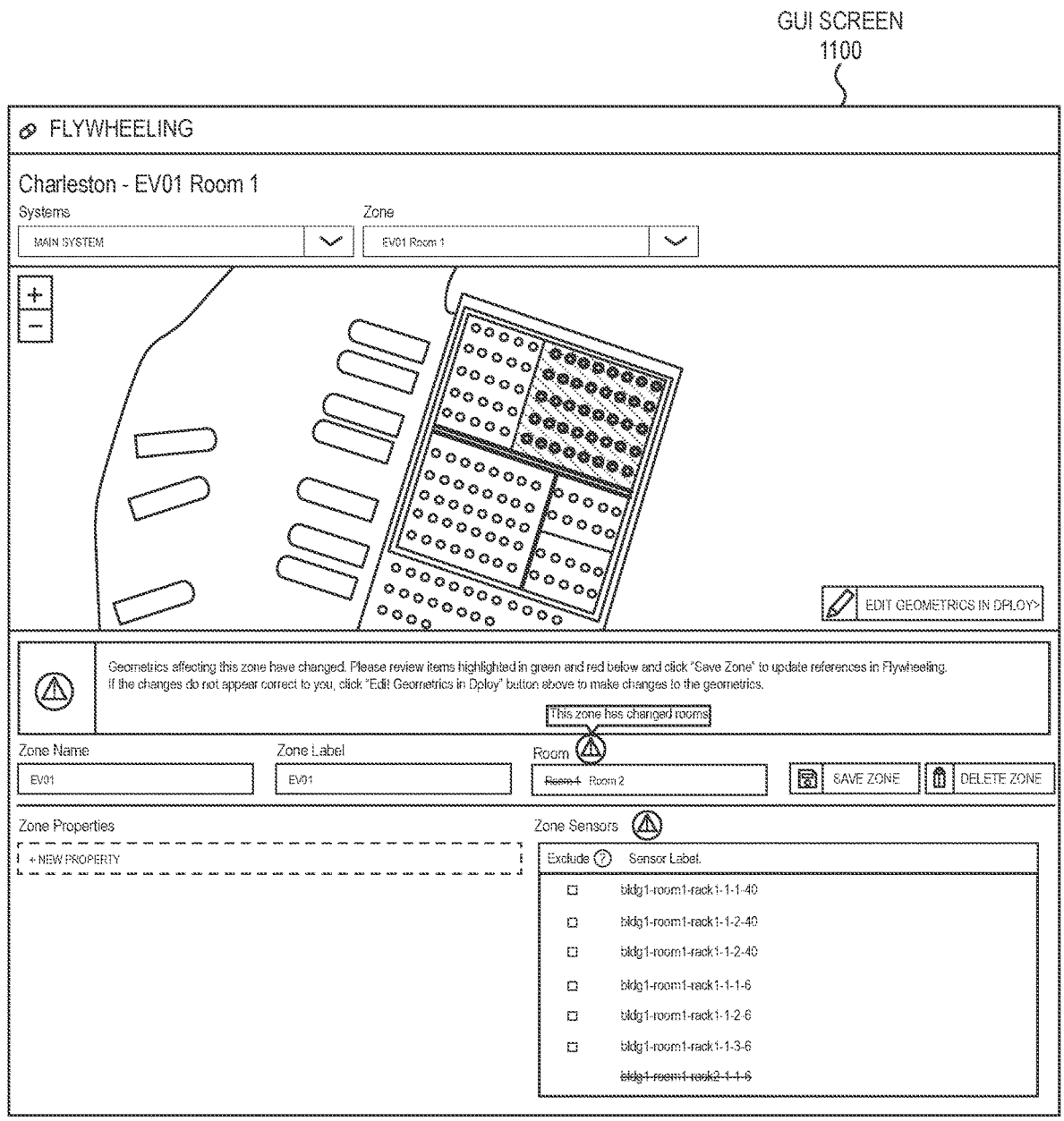
FIG. 11 depicts a GUI screen in accordance with embodiments of the present disclosure.

FIG. 11 depicts a GUI screen 1100 for making changes to the initial sensor provisioning instructions in accordance with embodiments of the present disclosure. For examples room/zone changes may be made to a subset of the deployed sensors. In this scenario, the sensor provisioning tool 235 may be further configured for transmitting at least a portion of the initial sensor provisioning instructions to the GUI 230. Upon user changes at the GUI 230, the sensor provisioning tool 235 receives updated sensor provisioning instructions. A second plurality of sensors may then be provisioned using the updated sensor provisioning instructions. The updated sensor provisioning instructions may also include a delta provisioning report.

Figure 12:
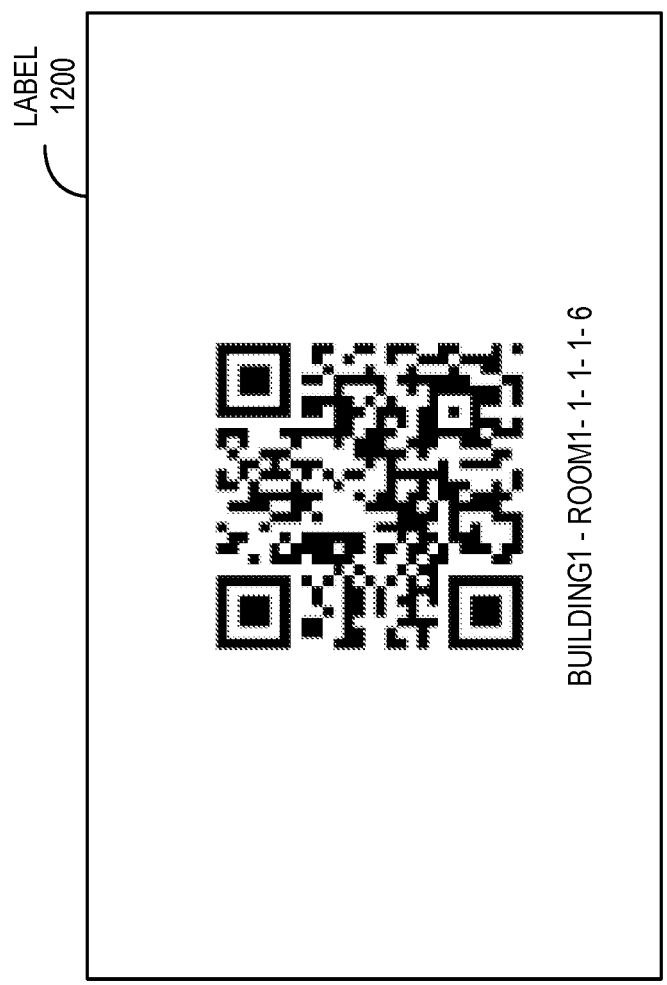
FIG. 12 depicts a label in accordance with embodiments of the present disclosure.

FIG. 12 illustrates a label 1200 in accordance with embodiments of the present disclosure. The label 1200 may be generated from the print file as described with label 160 of FIG. 1. The label 1200 displays a quick response (QR) code and a facility location that is human readable. In some embodiments, the facility location may include a facility identification (e.g. building number), a room identification, a rack identification, a sensor location identification, and/or an elevation to place the sensor. In other embodiments a bar code may be used instead of an QR code. A smart phone application may be used to read the bar code and/or QR code. The QR code and/or bar code may contain the unique sensor identification in addition to the displayed facility location.

Figure 13:
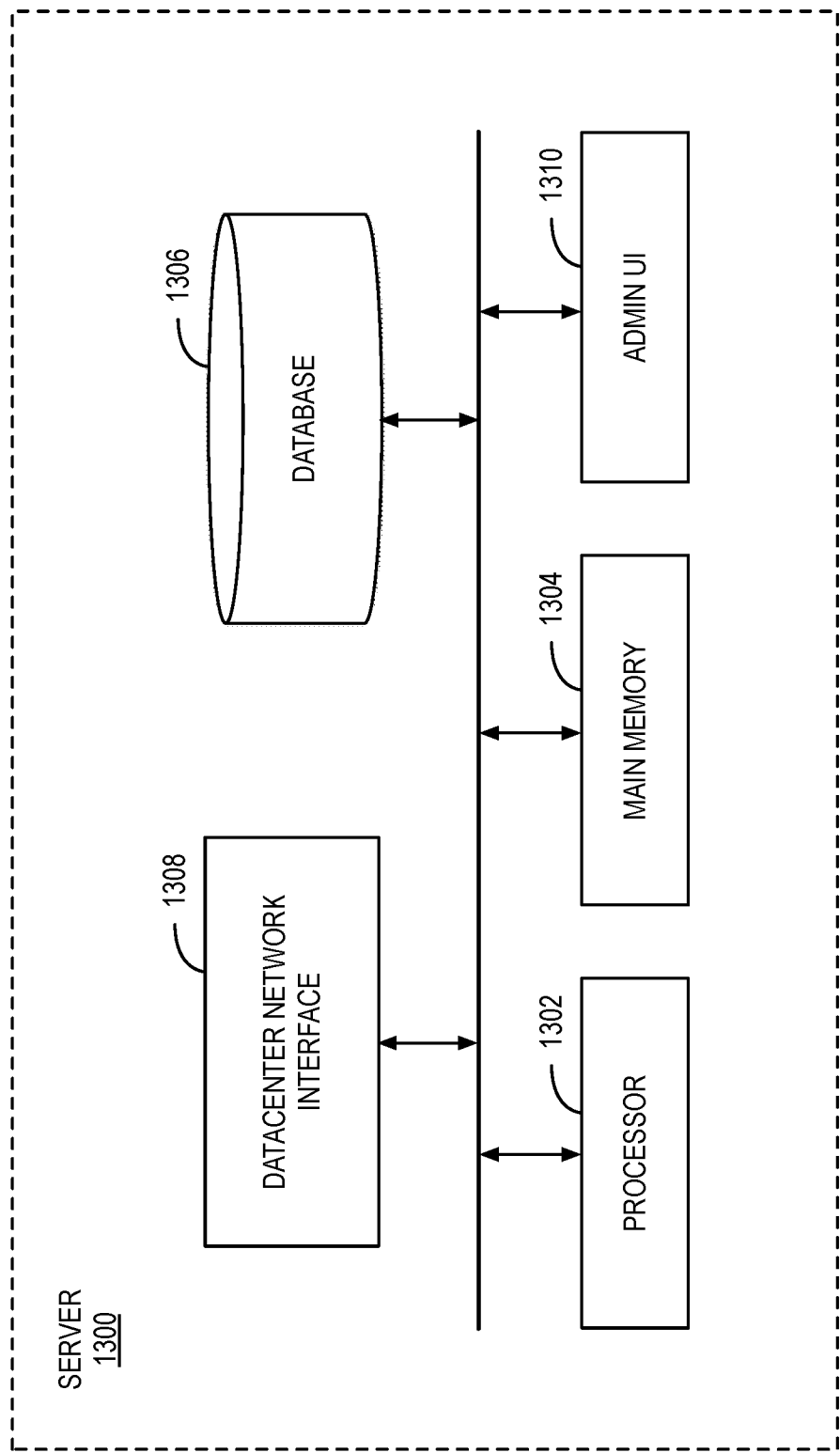
FIG. 13 depicts a block diagram of a server in accordance with embodiments of the present disclosure.

FIG. 13 illustrates a block diagram of a server 1300 in accordance with embodiments of the present disclosure. The server 1300 may provide hosting for at least a portion of the facility monitoring system 220 and the sensor provisioning tool 235 of FIG. 2. The server 1300 is a hardware server and may include at least one of a processor 1302, a main memory 1304, a database 1306, a datacenter network interface 1308, and an administration user interface (UI) 1310. The server 1300 may be configured to host a virtual server. For example the virtual server may be an Ubuntu® server or the like. The server 1300 may also be configured to host a virtual container. For example, the virtual server may be the Docker® virtual server or the like. In some embodiments, the virtual server and or virtual container may be distributed over a plurality of hardware servers using hypervisor technology.

The processor 1302 may be a multi-core server class processor suitable for hardware virtualization. The processor 1302 may support at least a 64-bit architecture and a single instruction multiple data (SIMD) instruction set. The main memory 1304 may include a combination of volatile memory (e.g. random access memory) and non-volatile memory (e.g. flash memory). The database 1306 may include one or more hard drives. The database 1306 may be an open source database such as the MongoDB® database, the PostgreSQL® database, or the like. The datacenter network interface 1308 may provide one or more high-speed communication ports to data center switches, routers, and/or network storage appliances. The datacenter network interface may include high-speed optical Ethernet, InfiniBand (IB), Internet Small Computer System Interface iSCSI, and/or Fibre Channel interfaces. The administration UI may support local and/or remote configuration of the server by a data center administrator.

Figure 14:
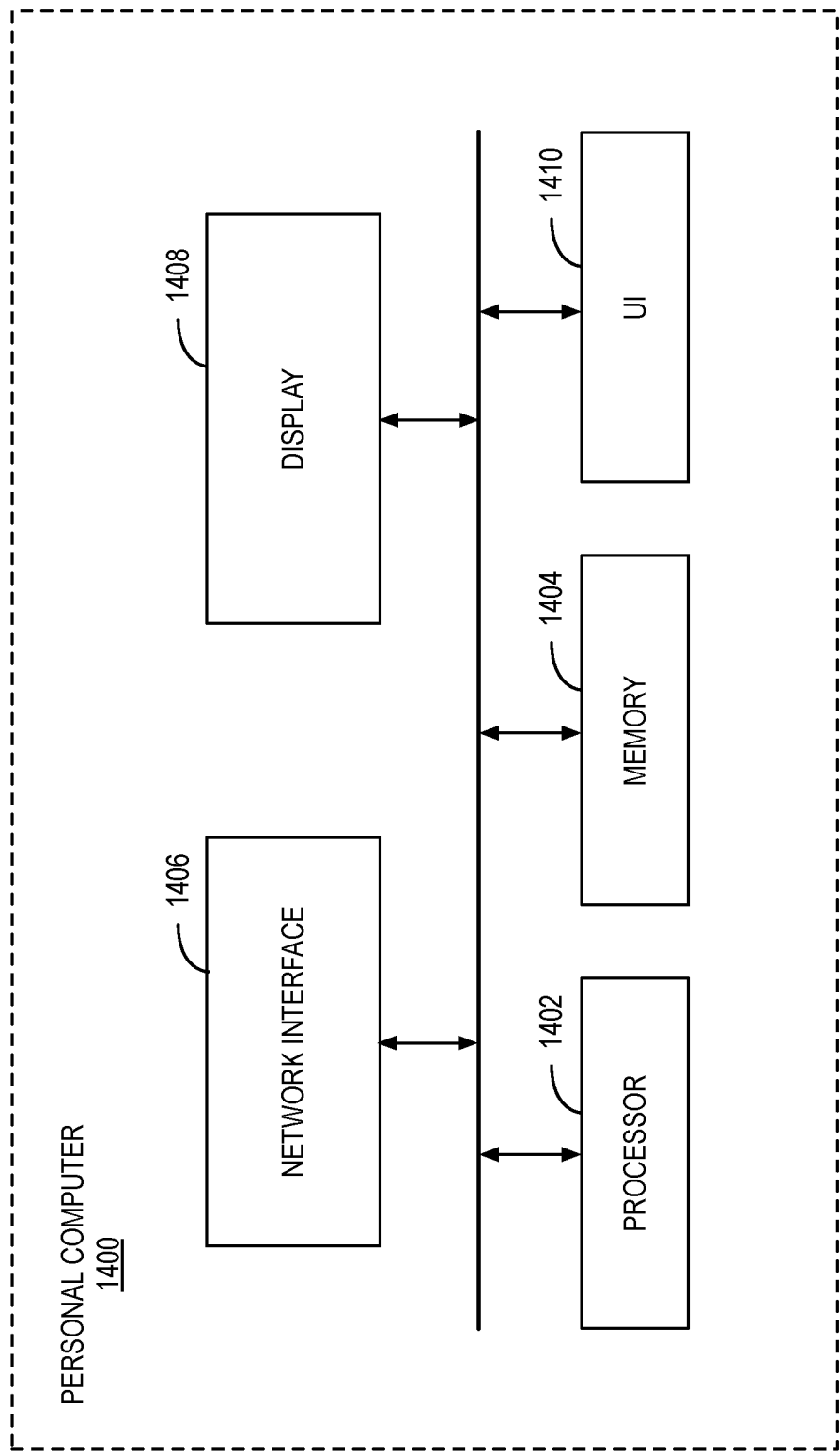
FIG. 14 depicts a block diagram of a personal computer in accordance with embodiments of the present disclosure.

FIG. 14 illustrates a block diagram of a personal computer 1400 in accordance with embodiments of the present disclosure. The personal computer 1400 provides hosting for the web browser and/or native application that provides the GUI 230 of FIG. 2. The personal computer 1400 may include at least a processor 1402, a memory 1404, a network interface 1406, a display 1408, and a user interface (UI) 1410. The personal computer 1400 may include an operating system to run the web browser and/or native application. The operating system (OS) may be a Windows® OS, a Macintosh® OS, or a Linux® OS. The memory may include a combination of volatile memory (e.g. random access memory) and non-volatile memory (e.g. solid state drive and/or hard drives).

The network interface 1406 may be a wired Ethernet interface or a Wi-Fi interface. The personal computer 1400 may be configured to access remote memory (e.g. network storage and/or cloud storage) via the network interface 1406. The display 1408 may be an external display (e.g. computer monitor) or internal display (e.g. laptop). The UI 1410 may include a keyboard, and a pointing device (e.g. mouse). In some embodiments, the personal computer 1400 may be a workstation class personal computer.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium (including, but not limited to, non-transitory computer readable storage media). A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including object oriented and/or procedural programming languages. Programming languages may include, but are not limited to: Ruby, JavaScript, Java, Python, Ruby, PHP, C, C++, C#, Objective-C, Go, Scala, Swift, Kotlin, OCaml, or the like. The program code may execute entirely on the user's computer, partly on the user's computer, as a stand-alone software package, partly on the user's computer, and partly on a remote computer or entirely on the remote computer or server. In the latter situation scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create an ability for implementing the functions/acts specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in FIG. 1 through FIG. 14 illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system comprising:
    one or more processors; and
    one or more memories including program instructions, when executed are configured for:
        receiving initial sensor provisioning instructions from a graphical user interface (GUI);
        storing the initial sensor provisioning instructions; and
        provisioning a first plurality of sensors using the initial sensor provisioning instructions, wherein:
            provisioning the first plurality of sensors comprises:
            determining a name, a serial number, a map location, and a template location for each sensor of the first plurality of sensors based on a first zone name and a location relative to georeferenced map data of an associated sensor representation within a first plurality of sensor representations;
            generating a print file for a label printer including label information for each sensor of the first plurality of sensors;
            the print file is configured for generating a printed label to be applied to a surface area of an enclosure associated with each sensor; and
            the label information comprises a human readable representation of a sensor deployment location and a representation of a unique identifier.

2. The system of claim 1, wherein the label information further comprises a sensor type.

3. The system of claim 1, wherein:
    provisioning the first plurality of sensors further comprises generating metadata for each sensor of the first plurality of sensors; and
    the metadata comprises a sensor type and the sensor deployment location.

4. The system of claim 3, wherein the sensor deployment location includes at least one of a georeferenced identifier, a building identifier, a room identifier, a zone identifier, and a wireless access point identifier.

5. The system of claim 3, wherein the sensor deployment location includes an elevation identifier.

6. The system of claim 5, wherein:
    the one or more memories including program instructions, when executed are further configured to provide a provisioning template to the GUI and the GUI is configured to receive the georeferenced map data; and
    the initial sensor provisioning instructions comprise the template location for each sensor of the first plurality of sensors.

7. The system of claim 6, wherein the provisioning template is an architectural template representing a facility to be monitored by the first plurality of sensors.

8. The system of claim 7, wherein the facility is at least one of a cold storage warehouse, an office complex, an apartment building, and an outdoor complex.

9. The system of claim 1, wherein:
    the GUI is configured to receive the georeferenced map data; and
    the initial sensor provisioning instructions comprise the georeferenced map data and the map location for each sensor of the first plurality of sensors.

10. The system of claim 9, wherein the georeferenced map data comprises elevation data.

11. The system of claim 1, wherein each sensor of the first plurality of sensors comprises a wireless interface.

12. The system of claim 11, wherein each sensor of the first plurality of sensors comprises at least one of a temperature sensor, a humidity sensor, and a pressure sensor.

13. The system of claim 11, wherein each sensor of the first plurality of sensors is at least one of a security sensor, a chemical sensor, a biological sensor, an acoustic sensor, and an optical sensor.

14. The system of claim 11, wherein each sensor of the first plurality of sensors is at least one of a flow sensor, a position sensor, a voltage sensor, a current sensor, a radio field (RF) sensor, and a proximity sensor.

15. The system of claim 1, wherein the system is a subsystem implemented within a facility monitoring system, and the facility monitoring system is configured to receive data from each sensor of the first plurality of sensors.

16. The system of claim 15, wherein the facility monitoring system is further configured to influence environmental control systems.

17. The system of claim 1, wherein:
    the one or more memories including program instructions, when executed are further configured for receiving sensor status data for each sensor, wherein the sensor status data for each sensor is received from the first plurality of sensors after installation of the first plurality of sensors per the initial sensor provisioning instructions; and
    the sensor status data for each sensor includes a health status for each sensor and the health status for each sensor includes at least one of a battery health indicator and a sensor failure indicator.

18. The system of claim 17, wherein the one or more memories including program instructions, when executed are further configured for:
- generating a sensor status overlay template using the sensor status data for each sensor and the initial sensor provisioning instructions, wherein the sensor status overlay template illustrates per sensor status data positioned about the template location for each sensor location; and
- transmitting the sensor status overlay template to the GUI.

19. The system of claim 1, wherein the one or more memories including program instructions, when executed are further configured for:
- transmitting at least a portion of the initial sensor provisioning instructions to the GUI;
- receiving updated sensor provisioning instructions, wherein the updated sensor provisioning instructions include a delta provisioning report; and
- provisioning a second plurality of sensors using the updated sensor provisioning instructions.

20. The system of claim 1, wherein the one or more memories including program instructions, when executed are further configured transmitting the print file to a label printer.

\* \* \* \* \*